(12) United States Patent
Moriwaki

(10) Patent No.: US 8,570,452 B2
(45) Date of Patent: Oct. 29, 2013

(54) ELECTRO-OPTICAL DEVICE HAVING A HOLDING CAPACITOR COMPRISING A FIRST ELECTRODE, A SECOND ELECTRODE, AND A THIRD ELECTRODE WITH A FIRST CAPACITOR INSULATION FILM AND A SECOND CAPACITOR INSULATION FILM EACH BEING FORMED OF FIRST AND SECOND CAPACITOR INSULATION LAYERS

(75) Inventor: Minoru Moriwaki, Fujimi-machi (JP)

(73) Assignee: Seiko Epson Corporation, Tokyo (JP)

( * ) Notice: Subject to any disclaimer, the term of this patent is extended or adjusted under 35 U.S.C. 154(b) by 435 days.

(21) Appl. No.: 13/079,203

(22) Filed: Apr. 4, 2011

(65) Prior Publication Data

US 2011/0242470 A1  Oct. 6, 2011

(30) Foreign Application Priority Data

Apr. 5, 2010 (JP) ................. 2010-086764

(51) Int. Cl.
*G02F 1/1343* (2006.01)
*G02F 1/1333* (2006.01)

(52) U.S. Cl.
USPC .......................................... 349/39; 349/138

(58) Field of Classification Search
USPC ............................................. 349/38–39, 138
See application file for complete search history.

(56) References Cited

U.S. PATENT DOCUMENTS

| 2004/0029338 A1 | 2/2004 | Yamazaki et al. |
| 2009/0128757 A1* | 5/2009 | Koshihara et al. ............ 349/114 |
| 2010/0033645 A1 | 2/2010 | Nakagawa |

FOREIGN PATENT DOCUMENTS

| JP | 2000-284722 A | 10/2000 |
| JP | 2010-039212 A | 2/2010 |

* cited by examiner

*Primary Examiner* — Paul Lee
(74) *Attorney, Agent, or Firm* — ALG Intellectual Property, LLC

(57) ABSTRACT

An electro-optical device includes: a pixel electrode provided on a substrate; a transistor being provided between the substrate and the pixel electrodes; and a holding capacitor, provided between the pixel electrode and the transistor, configured of a first electrode, a second electrode provided opposing the first electrode via a first capacitor insulation film, and a third electrode provided opposing the first electrode via a second capacitor insulation film. Both the first capacitor insulation film and the second capacitor insulation film have multiple layers; the first capacitor insulation film and the second electrode are formed symmetrical to the second capacitor insulation film and the third electrode when viewed from the first electrode.

7 Claims, 5 Drawing Sheets

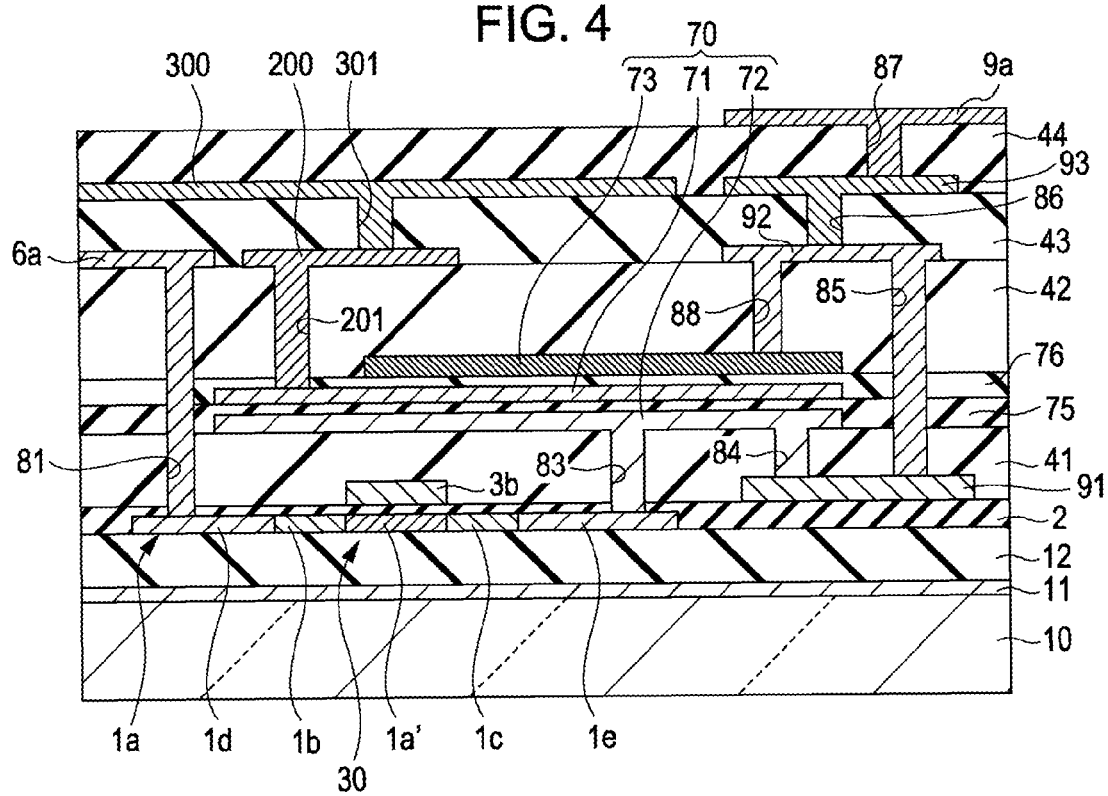

ELECTRO-OPTICAL DEVICE HAVING A HOLDING CAPACITOR COMPRISING A FIRST ELECTRODE, A SECOND ELECTRODE, AND A THIRD ELECTRODE WITH A FIRST CAPACITOR INSULATION FILM AND A SECOND CAPACITOR INSULATION FILM EACH BEING FORMED OF FIRST AND SECOND CAPACITOR INSULATION LAYERS

BACKGROUND

1. Technical Field

The present invention relates to the technical field of electro-optical devices such as liquid crystal devices and electronic apparatuses such as liquid crystal projectors that include such electro-optical devices.

2. Related Art

An electro-optical device in which pixel electrodes, scanning lines for selectively driving the pixel electrodes, data lines, and pixel switching thin-film transistors (TFTs) are provided upon a substrate and the device employs active-matrix driving, can be given as an example of this type of electro-optical device. The switching elements such as TFTs, the various types of wires, and so on are formed upon the substrate in a layered structure.

The stated electro-optical device attempts to achieve improved contrast, reduced flicker, and so on in displayed images by forming holding capacitors in the layered structure. For example, JP-A-2000-284722 proposes a technique in which an increase in capacitance is realized by connecting multiple holding capacitors in parallel.

However, in the stated case where multiple holding capacitors are formed, differences in the configurations of the respective holding capacitors (specifically, the materials, layered structure, and so on thereof) has been discovered through research by the inventors of this invention to cause an increase in fluctuations over time of a fixed potential supplied to the holding capacitors. Fluctuations over time of a fixed potential can cause, for example, flicker in displayed images, burn-in, and so on. Accordingly, the aforementioned technique has a technical problem in that there is a risk of a drop in the quality of the displayed image.

SUMMARY

An advantage of some aspects of the invention is to provide an electro-optical device and an electronic apparatus capable of displaying high-quality images.

An electro-optical device according to an aspect of the invention includes: pixel electrodes provided on a pixel-by-pixel basis on a substrate; transistors provided for each of the pixel electrodes, the transistors being provided between the substrate and the pixel electrodes; and holding capacitors provided between the pixel electrodes and the transistors, each holding capacitor being configured of a first electrode, a second electrode provided opposing the first electrode and on the lower layer side of the first electrode via a lower capacitor insulation film, and a third electrode provided opposing the first electrode and on the upper layer side of the first electrode via an upper capacitor insulation film. The lower capacitor insulation film and the upper capacitor insulation film each have multiple layers, and the lower capacitor insulation film and the second electrode are formed symmetrical to the upper capacitor insulation film and the third electrode when viewed from the first electrode.

In the electro-optical device according to the invention, an electro-optical material such as liquid crystals or the like is held between an element substrate in which pixel electrodes and transistors, which are pixel switching TFTs or the like electrically connected to the pixel electrodes, are provided, and an opposing substrate in which opposing electrodes that oppose the pixel electrodes are provided. When the electro-optical device is operating, an image display is carried out in a pixel region (or an image display region) in which multiple pixel electrodes are arranged by selectively supplying image signals to the pixel electrodes. Note that the image signal is supplied to the pixel electrode from a data line at a predetermined timing by the transistor, which is electrically connected between the data line and the pixel electrode, being switched on and off.

In the invention, a holding capacitor is provided between the pixel electrode and the transistor. The holding capacitor is configured by providing capacitor insulation films between the three electrodes, or the first electrode, the second electrode, and the third electrode. Specifically, the lower capacitor insulation film is provided between the first electrode and the second electrode on the lower layer side of the first electrode. In addition, the upper capacitor insulation film is provided between the first electrode and the third electrode on the upper layer side of the first electrode. In other words, the holding capacitor is configured by layering, in order from the lower layer side, the second electrode, the lower capacitor insulation film, the first electrode, the upper capacitor insulation film, and the third electrode.

The lower capacitor insulation film and the upper capacitor insulation film are each provided so as to have multiple layers. In other words, the lower capacitor insulation film and the upper capacitor insulation film are configured by layering respectively different layers. To be more specific, the lower capacitor insulation film and the upper capacitor insulation film are configured so as to include layers of $SiO_2$, SiN, or the like.

Particularly, in this invention, the stated holding capacitor is formed so that, when viewed from the first electrode, the other elements are symmetrical. In other words, the lower capacitor insulation film and the second electrode are formed symmetrical to the upper capacitor insulation film and the third electrode when viewed from the first electrode. Specifically, the multiple layers in the lower capacitor insulation film and the upper capacitor insulation film are formed so that layers of the same materials are arranged in the same order when viewed from the first electrode. To be even more specific, in the case where the lower capacitor insulation film has $SiO_2$ and SiN layered in that order from the lower layer side, the upper capacitor insulation film has SiN and $SiO_2$ layered in that order from the lower layer side. Furthermore, the second electrode and the third electrode are configured from the same material.

Note that "symmetry" as referred to in the invention relates to the materials of which the various elements are configured, as described above; the various elements do not need to be symmetrical with respect to the shapes, sizes, and so on thereof. In other words, the shape, size, and so on of the second electrode and the third electrode, the thickness and so on of the lower capacitor insulation film and the upper capacitor insulation film, and so on may be different from each other.

According to research carried out by the inventors of this invention, it has been discovered that configuring the holding capacitor in a symmetrical manner makes it possible to reduce fluctuations over time of a fixed potential supplied to the holding capacitor. Fluctuations over time of a fixed potential can cause flicker in displayed images, burn-in, and so on. Accordingly, with the holding capacitor according to this invention, such display problems can be prevented.

As described thus far, according to the electro-optical device of the invention, configuring the holding capacitor in a symmetrical manner makes it possible to display high-quality images.

In an electro-optical device according to another aspect of the invention, a predetermined constant potential is supplied to the first electrode, and the second electrode and the third electrode are electrically connected to the pixel electrode and the transistor respectively.

According to this aspect, the first electrode is electrically connected to, for example, a capacitor line via a contact hole, and a common potential supplied to the opposing electrode is supplied as a predetermined constant potential. On the other hand, the second electrode and the third electrode are electrically connected to, for example, the pixel electrode and a relay layer that provides an electrical connection between the transistor and the pixel electrode, via a contact hole. Accordingly, the second electrode and the third electrode are set to the same potential as the pixel electrode.

According to the configuration described above, holding capacitors can be formed between the first electrode and the second electrode and between the first electrode and the third electrode, and the configuration is such that those holding capacitors are connected in parallel. Accordingly, it is possible to form a high-density holding capacitor with a comparatively small surface area.

In an electro-optical device according to another aspect of the invention, the first electrode is electrically connected to the pixel electrode and the transistor, and predetermined constant potentials are supplied to the second electrode and the third electrode respectively.

According to this aspect, the first electrode is electrically connected to, for example, the pixel electrode and a relay layer that provides an electrical connection between the transistor and the pixel electrode, via a contact hole. Accordingly, the first electrode is set to the same potential as the pixel electrode. On the other hand, the second electrode and the third electrode are electrically connected to, for example, a capacitor line via a contact hole, and a common potential supplied to the opposing electrode is supplied as a predetermined constant potential.

According to the configuration described above, holding capacitors can be formed between the first electrode and the second electrode and between the first electrode and the third electrode, and the configuration is such that those holding capacitors are connected in parallel. Accordingly, it is possible to form a high-density holding capacitor with a comparatively small surface area.

An electronic apparatus according to another aspect of the invention includes the aforementioned electro-optical device according to the invention described above (including the various aspects thereof).

The electronic apparatus according to this aspect of the invention includes the electro-optical device according to the invention described above, and thus various types of electronic apparatuses such as projection-type display apparatuses, televisions, mobile telephones, PDAs, word processors, video recorders having viewfinders or monitor direct-type displays, workstations, videophones, POS terminals, touch panels, and so on that are capable of high-quality displays can be realized. An electrophoretic apparatus such as electronic paper can also be realized as an electronic apparatus according to this aspect of the invention.

These and other effects and advantages of the invention will be made clear from the embodiments of the invention described hereinafter.

BRIEF DESCRIPTION OF THE DRAWINGS

The invention will be described with reference to the accompanying drawings, wherein like numbers reference like elements.

FIG. 4 is a cross-sectional view illustrating a layered structure of the electro-optical device according to the first embodiment.

FIG. 5 is a conceptual diagram illustrating the detailed configuration of holding capacitors in the electro-optical device according to the first embodiment.

DESCRIPTION OF EXEMPLARY EMBODIMENTS

Hereinafter, embodiments of the invention will be described with reference to the drawings.
Electro-Optical Apparatus An electro-optical device according to this embodiment will be described with reference to FIGS. 1 through 8. Note that in the following embodiments, a TFT active-matrix driven type liquid crystal device having an internal driving circuit will be described as an example of the electro-optical device according to the invention.

First Embodiment

First, the overall configuration of an electro-optical device according to the first embodiment will be described with reference to FIGS. 1 and 2. Here, FIG. 1 is a plan view illustrating the overall configuration of the electro-optical device according to the first embodiment, and FIG. 2 is a cross-section viewed along the II-II line shown in FIG. 1.

Figure 1:
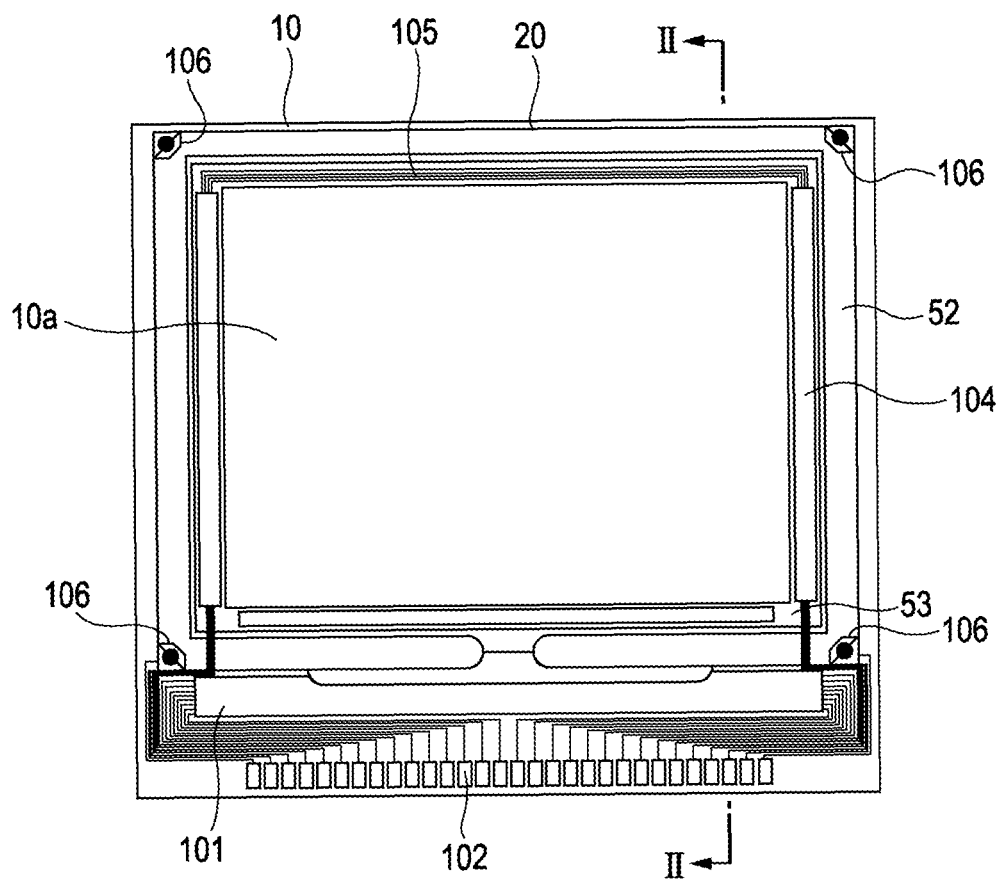
FIG. 1 is a plan view illustrating the overall configuration of an electro-optical device according to a first embodiment.
Figure 2:
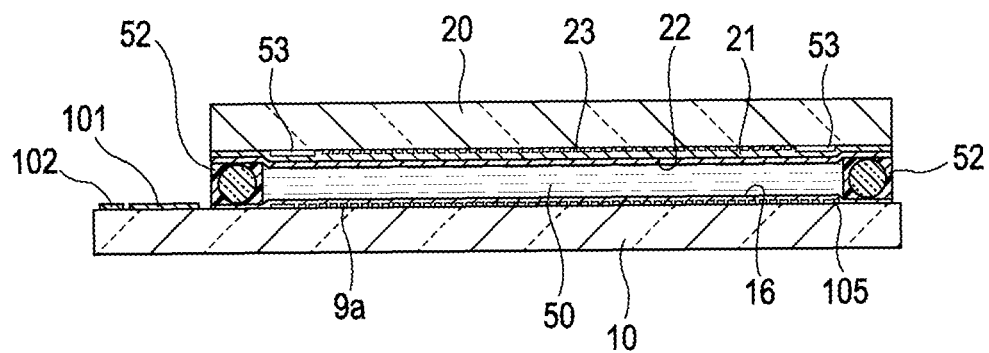
FIG. 2 is a cross-section viewed along the II-II line shown in FIG. 1.

In FIGS. 1 and 2, in an electro-optical device according to this embodiment, a TFT array substrate 10 and an opposing substrate 20 are disposed so as to oppose each other. The TFT array substrate 10 is, for example, a clear substrate such as a silica substrate, a glass substrate, or the like, a silicon substrate, or the like. The opposing substrate 20, meanwhile, is a clear substrate such as a silica substrate, a glass substrate, or the like. The space between the TFT array substrate 10 and the opposing substrate 20 is filled with a liquid crystal layer 50. The liquid crystal layer 50 is configured of liquid crystals in which, for example, one or more types of nematic liquid crystals are mixed, and these liquid crystals come to be in a predetermined state of orientation between two orientation layers.

The TFT array substrate 10 and the opposing substrate 20 are affixed to each other by a sealant 52 provided in a seal region located at the periphery of an image display region 10a in which multiple pixel electrodes are provided.

The sealant 52 is configured of, for example, an ultraviolet light-curable resin, heat-curable resin, or the like for affixing the substrates to each other, and in the manufacturing process, is cured through ultraviolet light irradiation, the application of heat, or the like after being applied to the TFT array substrate 10. Spacers (gap materials) such as glass fibers, glass beads, or the like are distributed throughout the sealant 52 in order to ensure that the space between the TFT array substrate 10 and the opposing substrate 20 (in other words, an inter-substrate gap) is a predetermined value. Note that the spacers may be disposed in the image display region 10a or a peripheral region located in the periphery of the image display region 10a in addition to or in place of spacers mixed with the sealant 52.

A light-blocking film border 53, which has light-blocking properties and defines the border region of the image display region 10a, is provided on the side of the opposing substrate 20 in parallel with the inner edge of the seal region in which the sealant 52 is disposed. Note, however, that some or all of this light-blocking film border 53 may be provided on the TFT array substrate 10 as an internal light-blocking film.

A data line driving circuit 101 and an external circuit connection terminal 102 are provided along one side of the TFT array substrate 10, in the region located on the outside of the seal region in which the sealant 52 is disposed, that is within the peripheral region. Scanning line driving circuits 104 are provided along the two sides that are adjacent to that side, and are provided so as to be covered by the light-blocking film border 53. Furthermore, multiple wires 105 are provided, covered by the light-blocking film border 53, along the remaining side of the TFT array substrate 10 in order to connect the two scanning line driving circuits 104 provided on either side of the image display region 10a.

Upper and lower conductive terminals 106 for connecting the two substrates through upper and lower conductive materials are disposed in the four corners of the TFT array substrate 10 in locations that oppose the opposing substrate 20. Accordingly, electrical conductivity is achieved between the TFT array substrate 10 and the opposing substrate 20.

As shown in FIG. 2, a layered structure in which pixel switching TFTs serving as driving elements and lines such as scanning lines and data lines are embedded is formed upon the TFT array substrate 10. Although the detailed configuration of this layered structure has been omitted from FIG. 2, pixel electrodes 9a configured of a transparent material such as ITO (Indium Tin Oxide) are formed upon the layered structure in island form, in a predetermined pattern for each pixel.

The pixel electrodes 9a are formed in the image display region 10a upon the TFT array substrate 10 so as to oppose opposing electrodes 21. An orientation layer 16 is formed upon the surface of the TFT array substrate 10 that faces the liquid crystal layer 50, or in other words, upon the pixel electrodes 9a, so as to cover the pixel electrodes 9a.

A light-blocking film 23 is formed on the surface of the opposing substrate 20 that opposes the TFT array substrate 10. The light-blocking film 23 is formed on the opposing surface in a grid shape when viewed, for example, from above the opposing substrate 20. Closed regions are defined in the opposing substrate 20 by the light-blocking film 23, and thus the regions divided up by the light-blocking film 23 serve as open regions that allow light emitted by, for example, the lamp of a projector or a backlight for direct view to pass through. Note that the light-blocking film 23 may be formed in a striped shape, and the closed regions may be defined by the light-blocking film 23 and the various constituent elements such as the data lines provided in the TFT array substrate 10.

The opposing electrodes 21, configured of a transparent material such as ITO, are formed upon the light-blocking film 23 so as to oppose the multiple pixel electrodes 9a. A color filter, which is not shown in FIG. 2, may be formed upon the light-blocking film 23 in regions that include the open regions and part of the closed regions, in order to implement color displays in the image display region 10a. An orientation layer 22 is formed on the opposing electrodes 21 on the opposing surface of the opposing substrate 20.

Note that in addition to the driving circuits such as the data line driving circuit 101, the scanning line driving circuit 104, and so on mentioned earlier, a sampling circuit that samples image signals in an image signal line and supplies the samples to the data lines, a precharging circuit for supplying precharge signals of a predetermined voltage level to the multiple data lines prior to image signals, an examination circuit for inspecting the quality of and discovering the defects in the electro-optical device during manufacture and shipping, and so on may be formed upon the TFT array substrate 10 illustrated in FIGS. 1 and 2.

Next, the electrical configuration of the pixel units in the electro-optical device according to this embodiment will be described with reference to FIG. 3. Here, FIG. 3 is an equivalent circuit diagram illustrating the various types of elements, wires, and so on in multiple pixels, formed in matrix form, that configure an image display region in the electro-optical device according to this embodiment.

Figure 3:
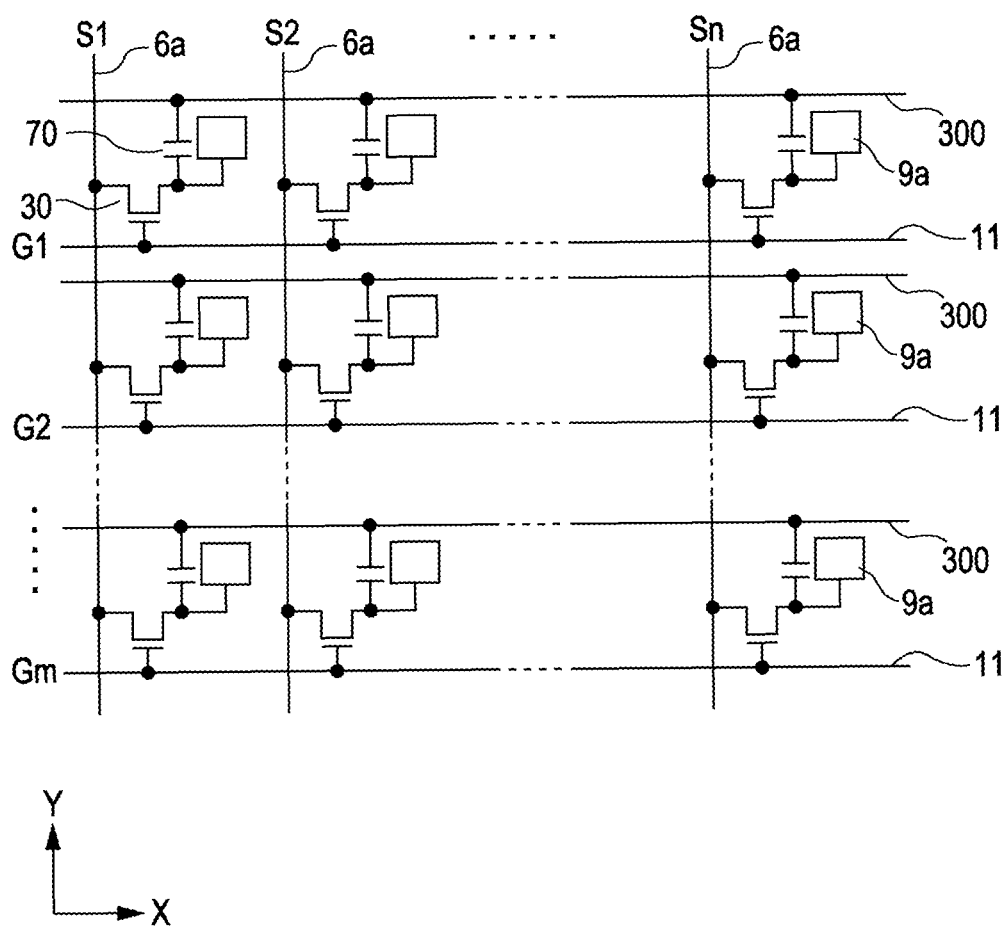
FIG. 3 is an equivalent circuit diagram illustrating various elements, wires, and so on in an image display region of the electro-optical device according to the first embodiment.

In FIG. 3, a pixel electrode 9a and a TFT 30 is formed in each of the multiple pixels, formed in matrix form, that configure the image display region 10a. The TFT 30 is electrically connected to the pixel electrode 9a, and controls the switching of the pixel electrode 9a when the electro-optical device according to this embodiment is operating. A data line 6a to which an image signal is supplied is electrically connected to the source of the TFT 30. Image signals S1, S2, and so on up to Sn written into the data line 6a may be supplied line-sequentially in this order, or may be supplied in groups to multiple data lines 6a that are adjacent to each other.

A scanning line 11 is electrically connected to the gate of the TFT 30, and the electro-optical device according to this embodiment is configured so that scanning signals G1, G2, and so on up to Gm are applied to the scanning line 11 as pulses, line-sequentially in that order, at a predetermined timing. The pixel electrode 9a is electrically connected to the drain of the TFT 30, and by closing the switch of the TFT 30, which is a switching element, for a set interval, the image signals S1, S2, and so on up to Sn supplied from the data line 6a are written at a predetermined timing. The predetermined-level image signals S1, S2, and so on up to Sn written through the pixel electrode 9a to the liquid crystals, serving as an example of an electrode-optical material, are held for a set interval between the opposing electrodes formed in the opposing substrate and the pixel electrode 9a.

The liquid crystals of which the liquid crystal layer 50 (see FIG. 2) is configured are capable of performing grayshade through the modulation of light, which is accomplished by changing the orientation, order, and so on of the molecular aggregation in accordance with the level of an applied voltage. For example, in a normal white mode, the transmissibility of incident light drops in accordance with the voltage applied at the pixel level, whereas in a normal black mode, the transmissibility of incident light rises in accordance with the voltage applied at the pixel level, and thus overall, light having a contrast based on an image signal is emitted from the electro-optical device.

Here, in order to prevent the held image signal from leaking, storage capacitors 70 are added in parallel with liquid crystal capacitors formed between the pixel electrodes 9a and the opposing electrodes 21 (see FIG. 2). The storage capacitor 70 is a capacitance element functioning as a holding capacitor that temporarily holds the potential of a corresponding pixel electrode 9a in accordance with the image signal supply. The specific configuration of the storage capacitor 70 will be described later.

Next, the specific configuration of the pixel unit that realizes the aforementioned operations will be described with reference to FIGS. 4 and 5. Here, FIG. 4 is a cross-sectional view illustrating a layered structure of the electro-optical device according to the first embodiment. Meanwhile, FIG. 5 is a conceptual diagram illustrating the detailed configuration of the holding capacitor of the electro-optical device according to the first embodiment. Note that in FIG. 4, the scale of the various layers and members are illustrated as being different from the actual scales in order to enable those layers and members to be recognizable in the drawings.

In FIG. 4, the TFT 30 is configured so as to include a semiconductor layer 1a and a gate electrode 3b.

The semiconductor layer 1a is configured of, for example, polysilicon, and has a channel region 1a', a data line-side LDD region 1b, a pixel electrode-side LDD region 1c, a data line-side source drain region 1d, and a pixel electrode-side source drain region 1e. In other words, the TFT 30 has an LDD structure.

The data line-side source drain region 1d and the pixel electrode-side source drain region 1e are formed in essentially mirror symmetry along the Y direction, using the channel region 1a' as a reference. The data line-side LDD region 1b is formed between the channel region 1a' and the data line-side source drain region 1d. The pixel electrode-side LDD region 1c, meanwhile, is formed between the channel region 1a' and the pixel electrode-side source drain region 1e.

The data line-side LDD region 1b, the pixel electrode-side LDD region 1c, the data line-side source drain region 1d, and the pixel electrode-side source drain region 1e are impurity regions achieved by implanting impurities in the semiconductor layer 1a through an impurity implantation method such as ion implantation. The data line-side LDD region 1b and the pixel electrode-side LDD region 1c are formed as impurity regions having a lower concentration of impurities than the data line-side source drain region 1d and the pixel electrode-side source drain region 1e, respectively. Using such impurity regions makes it possible to reduce an off current that flows between the source regions and the drain regions when the TFT 30 is not operational, as well as suppress a drop in an on current that flows when the TFT 30 is operational.

Note that while it is preferable for the TFT 30 to have an LDD structure, the structure may be an offset structure, in which impurity implantation is not carried out for the data line-side LDD region 1b and the pixel electrode-side LDD region 1c, or may be a self-aligning type, in which a data line-side source drain region and a pixel electrode-side source drain region are formed by using a gate electrode as a mask and implanting impurities at high concentrations.

The gate electrode 3b is formed from, for example, conductive polysilicon, and to partially opposed to the channel region 1a' of the semiconductor layer 1a. The space between the gate electrode 3b and the semiconductor layer 1a is insulated by a gate insulation film 2. Furthermore, a first relay layer 91 is formed in the same layer as the gate electrode 3b.

The scanning line 11 is provided in a lower layer than the TFT 30 in the TFT array substrate 10, via a base insulation film 12. The scanning line 11 is configured of a light-blocking material such as a single metal, an alloy, a metallic silicide, a polysilicide, several of these materials layered upon each other, or the like, including at least one of the following high-melting point metals: Ti (titanium), Cr (chromium), W (tungsten), Ta (tantalum), Mo (molybdenum), Pd (palladium), or the like. The scanning line 11 also functions as a lower light-blocking film that blocks the channel region 1a' of the TFT 30 and the periphery thereof from returning light entering into the apparatus from the TFT array substrate 10, the returning light being light reflected at the back surface of the TFT array substrate 10, light emitted from another liquid crystal apparatus such as a multi-plate projector that escapes through a combined optical system, and so on.

In addition to functioning as an inter-layer insulator that insulates the scanning line 11 from the TFT 30, the base insulation film 12 also has a function of preventing the degradation of the properties of the pixel switching TFT 30 caused by abrasion when polishing the surface of the TFT array substrate 10, dirt that remains after cleaning, and so on, by being formed across the entire surface of the TFT array substrate 10.

The storage capacitor 70 is provided in a higher layer than the TFT 30 on the TFT array substrate 10, via a first inter-layer insulation film 41. The storage capacitor 70 is an example of a "holding capacitor" according to the invention, and is formed by a first electrode 71 and a second electrode 72 being oppositely disposed via a lower capacitor insulation film 75, and via an upper capacitor insulation film 76, the first electrode 71 and a third electrode 73 being oppositely disposed.

The first electrode 71 is a fixed-potential-side capacitor electrode that is electrically connected to a constant potential source via a capacitor line 300 and a capacitor relay layer 200, and is maintained at a fixed potential. The first electrode 71 is formed of a non-transparent metallic film that includes a metal such as Al (aluminum), Ag (silver), or the like, or an alloy, and functions as an upper light-blocking film (internal light-blocking film) that blocks light from the TFT 30. Note that the first electrode 71 may be configured from a single metal, an alloy, a metallic silicide, a polysilicide, several of these materials layered upon each other, or the like, including at least one of the following high-melting point metals: Ti, Cr, W, Ta, Mo, Pd, or the like. In this case, it is possible to improve the functionality of the first electrode 71 as an internal light-blocking film.

The second electrode 72 is a pixel potential-side capacitor electrode that is electrically connected to the pixel electrode-side source drain region 1e and the pixel electrode 9a of the TFT 30. To be more specific, the second electrode 72 is electrically connected to the pixel electrode-side source drain region 1e via a contact hole 83, and is electrically connected to the first relay layer 91 via a contact hole 84. The first relay layer 91 is electrically connected to a second relay layer 92 via a contact hole 85. The second relay layer 92 is electrically connected to a third relay layer 93 via a contact hole 86. The third relay layer 93 is electrically connected to the pixel electrode 9a via a contact hole 87. In other words, the second electrode 72 provides the electrical connection between the pixel electrode-side source drain region 1e and the pixel electrode 9a along with the first relay layer 91, the second relay layer 92, and the third relay layer 93.

The third electrode 73 is electrically connected to the second relay layer 92 via a contact hole 88. Through this, the third electrode 73 is set to the same potential as the second electrode 72 (to rephrase, is set to the same potential as the pixel electrode 9a).

The lower capacitor insulation film 75 and the upper capacitor insulation film 76 both have multilayer structures configured of, for example, a silicon oxide ($SiO_2$) film such as an HTO (High Temperature Oxide) film, a LTO (Low Temperature Oxide) film, or the like, or of a silicon nitride (SiN) film.

Here, the storage capacitor 70 according to this embodiment in particular is configured so that two capacitors connected in parallel are symmetrical. The specific configuration of the storage capacitor 70 will be described hereinafter.

In FIG. 5, the lower capacitor insulation film 75 has, in order starting from the side toward the first electrode 71, a first capacitor insulation layer 75a configured of SiN, and a second capacitor insulation layer 75b configured from $SiO_2$. On the other hand, the upper capacitor insulation film 76 has, in order starting from the side toward the first electrode 71, a third capacitor insulation layer 76a configured of SiN, and a fourth capacitor insulation layer 76b configured of $SiO_2$. Furthermore, the second electrode 72 and the third electrode 73 are formed of the same material as each other.

According to the stated configuration, the capacitor formed between the first electrode 71 and the second electrode 72 and the capacitor formed between the first electrode 71 and the third electrode 73 are symmetrical when viewed from the first electrode 71. In other words, the first capacitor insulation layer 75a configured of SiN, the second capacitor insulation layer 75b configured of $SiO_2$, and the second electrode 72 are disposed in that order on the lower layer side as viewed from the first electrode 71. On the other hand, the third capacitor insulation layer 76a configured of SiN, the fourth capacitor insulation layer 76b configured of $SiO_2$, and the third electrode 73 are disposed in that order on the upper layer side as viewed from the first electrode 71. Accordingly, the capacitors formed on the lower layer side and the upper layer side of the first electrode are configured so that the materials thereof are symmetrical.

According to research performed by the inventors of this invention, it has been found that the change over time in the supplied fixed potential (in other words, LCCOM) can be reduced by providing the storage capacitors 70 connected in parallel with symmetry. Fluctuations over time of a fixed potential can cause flicker in displayed images, burn-in, and so on. Accordingly, with the storage capacitor 70 according to this embodiment, such display problems can be prevented.

Note that as long as the various elements of which the storage capacitors 70 are formed are symmetrical in terms of materials, those elements need not be symmetrical in terms of shape, size, or the like. Accordingly, the stated effects can be sufficiently achieved even in the case where the holding capacitors 70 are configured of members having different shapes, sizes, or the like.

Returning to FIG. 4, the data line 6a, the capacitor relay layer 200, and the second relay layer 92 are provided on the upper layer side of a second inter-layer insulation film 42 above the storage capacitors 70 on the TFT array substrate 10.

The data line 6a is electrically connected to the data line-side source drain region 1d of the semiconductor layer 1a via a contact hole 81 that passes through the first inter-layer insulation film 41 and the second inter-layer insulation film 42. The data line 6a and the interior of the contact hole 81 are configured of an Al (aluminum)-containing material such as Al—Si—Cu, Al—Cu, or the like, Al alone, or a multilayer film having an Al layer, a TiN layer, or the like. The data line 6a has a function for blocking light from the TFT 30.

The capacitor relay layer 200 and the second relay layer 92 are formed in the same layer as the data line 6a upon the second inter-layer insulation film 42. The data line 6a, the capacitor relay layer 200, and the second relay layer 92 are formed separated from each other by first forming a thin film configured of a conductive material such as a metallic film upon the second inter-layer insulation film 42 using a deposition technique and then partially removing, or patterning, the thin film. In this manner, forming the data line 6a, the capacitor relay layer 200, and the second relay layer 92 in the same step can make the manufacturing process for the apparatus simpler.

The capacitor line 300 and the third relay layer 93 are provided above the data line 6a of the TFT array substrate 10 via a third inter-layer insulation film 43.

The capacitor line 300 is configured so as to include, for example, a metal such as aluminum, and as mentioned above, supplies a fixed potential to the first electrode 71. On the other hand, the third relay layer 93, which is formed in the same layer as the capacitor line 300, provides electrical conductivity between the pixel electrode-side source drain region 1e and the pixel electrode 9a in the semiconductor layer 1a.

The pixel electrode 9a is formed on the upper layer side above the capacitor line 300 via a fourth inter-layer insulation film 44. The pixel electrode 9a is electrically connected to the pixel electrode-side source drain region 1e of the semiconductor layer 1a via the third relay layer 93, the second relay layer 92, the first relay layer 91, and the second electrode 72. The contact hole 87 that electrically connects the pixel electrode 9a and the third relay layer 93 is formed by depositing a conductive material of which the pixel electrode 9a is configured, such as ITO or the like, on the inner wall of a hole portion formed so as to pass through a fourth inter-layer insulation film 44. An orientation layer, on which a predetermined orientation process such as a rubbing process has been carried out, is provided on the upper surface of the pixel electrode 9a.

The configuration of the pixel unit as stated thus far is the same for all of the pixel units, and those pixel units are formed periodically in the image display region 10a (see FIG. 1).

As described thus far, according to the electro-optical device of the invention, the storage capacitor 70 provided between the TFT 30 and the pixel electrode 9a is configured so as to be symmetrical. Accordingly, display problems can be prevented, and it is thus possible to display high-quality images.

Second Embodiment

Figure 6:
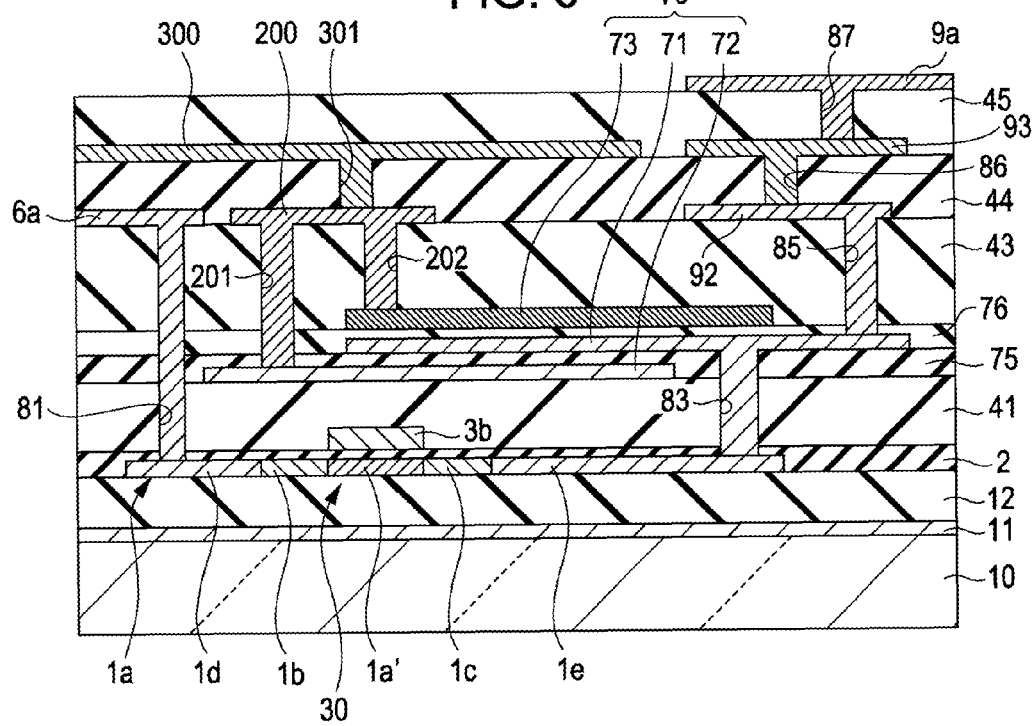
FIG. 6 is a cross-sectional view illustrating a layered structure of an electro-optical device according to a second embodiment.
Figure 7:
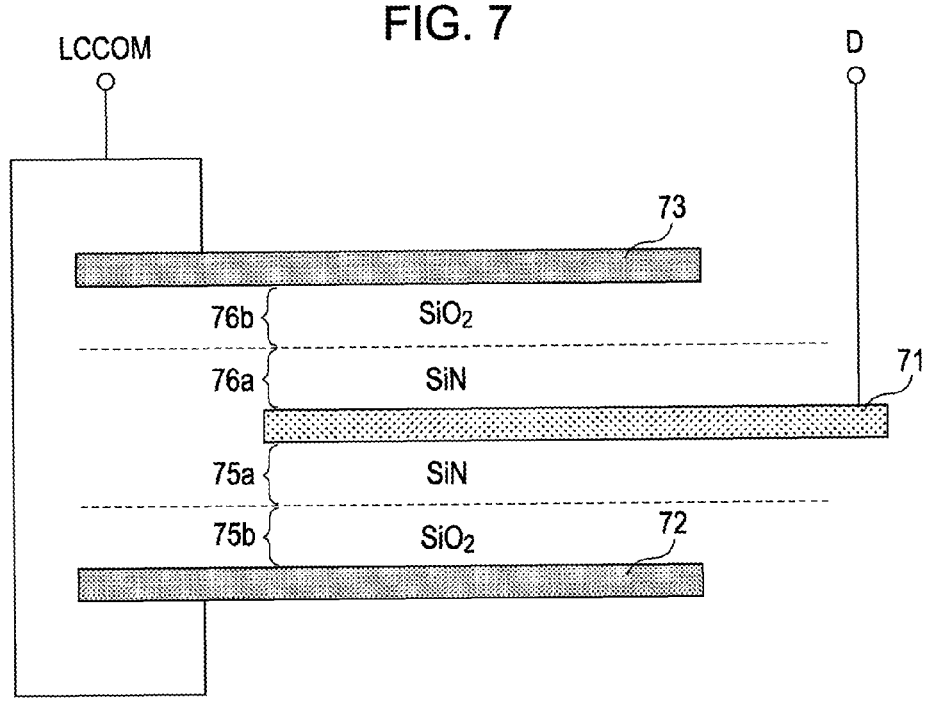
FIG. 7 is a conceptual diagram illustrating the detailed configuration of holding capacitors in the electro-optical device according to the second embodiment.

Next, the configuration of an electro-optical device according to a second embodiment will be described with reference to FIGS. 6 and 7. Here, FIG. 6 is a cross-sectional view illustrating a layered structure of the electro-optical device according to the second embodiment. Meanwhile, FIG. 7 is a conceptual diagram illustrating the detailed configuration of a holding capacitor of the electro-optical device according to the second embodiment. Note that in FIG. 6, the scale of the various layers and members are illustrated as being different from the actual scales in order to enable those layers and members to be recognizable in the drawings.

In the second embodiment described hereinafter, part of the layered structure is different from that described in the aforementioned first embodiment, but the rest of the configuration is generally the same. Accordingly, in the second embodiment, the areas that differ from the first embodiment will be described in detail, while other redundant areas will be omitted for the sake of simplicity.

As shown in FIG. 6, with the electro-optical device according to the second embodiment, the first electrode 71 is electrically connected between the TFT 30 and the pixel electrode 9a. To be more specific, the first electrode 71 is electrically connected to the pixel electrode-side source drain region 1e of the semiconductor layer 1a via the contact hole 83, and is electrically connected to the second relay layer 92 via the contact hole 85.

On the other hand, the second electrode 72 and the third electrode 73 are electrically connected to the capacitor line 300. Specifically, the second electrode 72 and the third electrode 73 are electrically connected to the capacitor relay layer 200 via a contact hole 201 and a contact hole 202, respectively.

As described above, in the electro-optical device according to the second embodiment, the electrical relationships of the electrodes that configure the storage capacitor 70 are opposite to those in the electro-optical device according to the first embodiment. Even in such a case, two capacitors connected in parallel can be realized on both the upper layer side and the lower layer side of the first electrode 71.

In FIG. 7, the lower capacitor insulation film 75 has, in order starting from the side facing the first electrode 71, a first capacitor insulation layer 75a configured of SiN, and a second capacitor insulation layer 75b configured of $SiO_2$. On the other hand, the upper capacitor insulation film 76 has, in order starting from the side toward the first electrode 71, a third capacitor insulation layer 76a configured of SiN, and a fourth capacitor insulation layer 76b configured of $SiO_2$. Furthermore, the second electrode 72 and the third electrode 73 are formed of the same material as each other.

According to the stated configuration, the capacitor formed between the first electrode 71 and the second electrode 72 and the capacitor formed between the first electrode 71 and the third electrode 73 are symmetrical when viewed from the first electrode 71. Accordingly, as in the first embodiment, the capacitors formed on the lower layer side and the upper layer side of the first electrode are configured so that the materials thereof are symmetrical.

As described thus far, according to the electro-optical device of the second embodiment, the storage capacitor 70 provided between the TFT 30 and the pixel electrode 9a is configured so as to be symmetrical. Accordingly, display problems can be prevented, and it is thus possible to display high-quality images.

Electronic Device

Figure 8:
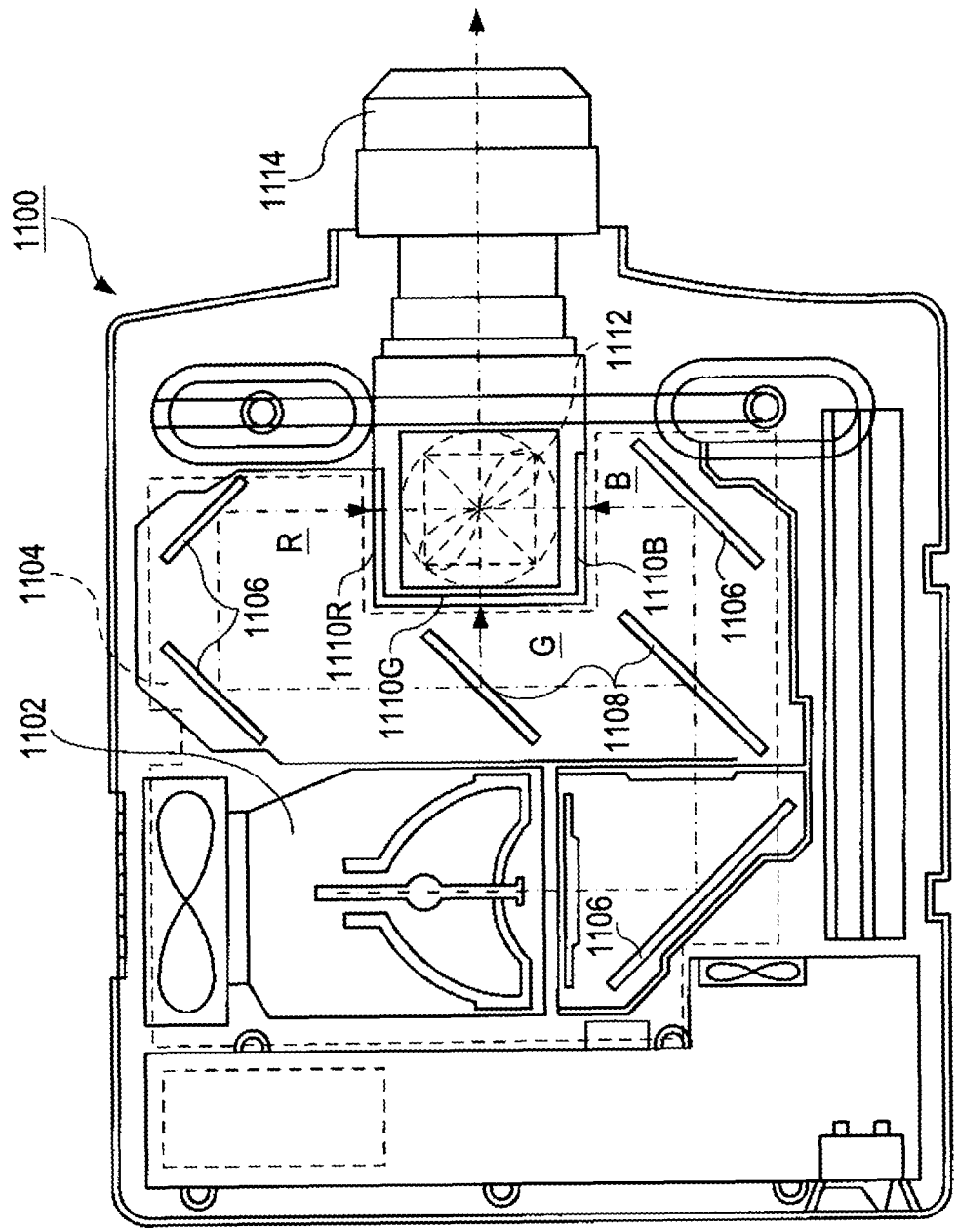
FIG. 8 is a plan view illustrating the configuration of a projector serving as an example of an electronic apparatus in which an electro-optical device has been applied.

Next, cases in which a liquid crystal device, which corresponds to the electro-optical devices described thus far, is applied in an electronic apparatus will be described. Here, FIG. 8 is a plan view illustrating an example of the configuration of a projector. Hereinafter, a projector that uses the stated liquid crystal device as its light valve will be described.

As shown in FIG. 8, a lamp unit 1102 configured of a white light source such as a halogen lamp is provided in a projector 1100. Projection light emitted from the lamp unit 1102 is split into the three primary RGB colors by four mirrors 1106 and two dichroic mirrors 1108 disposed within a light guide 1104, and then enters into liquid crystal panels 1110R, 1110B, and 1110G serving as light valves corresponding to the respective primary colors.

The configurations of the liquid crystal panels 1110R, 1110B, and 1110G are the same as the aforementioned liquid crystal device, and are respectively driven by R, G, and B primary color signals supplied from an image signal processing circuit. The light that has been modulated by these liquid crystal panels enters into a dichroic prism 1112 from three directions. In this dichroic prism 1112, the R and B lights are refracted by 90 degrees, whereas the G light proceeds directly. Accordingly, the result of combining images of the three colors is projected as a color image onto a screen or the like through a projection lens 1114.

Here, focusing on the display images of the respective liquid crystal panels 1110R, 1110B, and 1110G, it is necessary to invert the display image of the liquid crystal panel 1110G horizontally relative to the display images of the liquid crystal panels 1110R and 1110B.

Note that because light corresponding to the respective primary colors of R, G, and B enters into the liquid crystal panels 1110R, 1110B, and 1110G due to the dichroic mirrors 1108, it is not necessary to provide a color filter.

Note that the following can also be given as examples of the electronic apparatus described with reference to FIG. 8: laptop computers, mobile telephones, liquid crystal televisions, video recorders having viewfinders or monitor-type direct displays, car navigation apparatuses, pagers, PDAs, calculators, word processors, workstations, videophones, POS terminals, apparatuses including touch panels, and so on. It goes without saying that the invention can be applied in such various types of electronic apparatuses as well.

In addition to the liquid crystal devices described in the aforementioned embodiments, the invention can also be applied in reflective liquid crystal devices (LCOS), plasma displays (PDP), field emission displays (FED, SED), organic EL displays, digital micromirror devices (DMD), electrophoretic devices, and so on.

The invention is not intended to be limited to the aforementioned embodiments, and many variations can be made thereon without departing from the essential spirit of the invention as set forth in the aspects and the specification as a whole; electro-optical devices derived from such modifications and electronic apparatuses provided with such electro-optical devices also fall within the technical scope of the invention.

The entire disclosure of Japanese Patent Application No. 2010-086764, filed Apr. 5, 2010 is expressly incorporated by reference herein.

What is claimed is:

1. An electro-optical device comprising:
a pixel electrode provided on a substrate;
a transistor provided corresponding to the pixel electrode, the transistor being provided between the substrate and the pixel electrode; and
a holding capacitor provided between the pixel electrode and the transistor, the holding capacitor including:
a first electrode;
a second electrode provided opposing the first electrode via a first capacitor insulation film, the first capacitor insulation film having:
a first capacitor insulation layer provided between the first electrode and the second electrode; and
a second capacitor insulation layer provided between the first capacitor insulation layer and the second electrode, the second capacitor insulation layer being made from a material different from a material of the first capacitor insulation layer; and
a third electrode provided opposing the first electrode via a second capacitor insulation film, the second capacitor insulation film having:
a third capacitor insulation layer provided between the first electrode and the third electrode, the third capacitor insulation layer being made from a same material as a material of the first capacitor insulation layer; and a fourth capacitor insulation layer provided between the third capacitor insulation layer and the third electrode, the fourth capacitor insulation layer being made from a same material as a material of the second capacitor insulation layer.

2. The electro-optical device according to claim 1,
wherein the second electrode and the third electrode are electrically connected to a relay layer provided between the pixel electrode and the holding capacitor via different contact holes.

3. The electro-optical device according to claim 1,
wherein the first electrode is electrically connected to a capacitor line; and
the second electrode and the third electrode are electrically connected to the pixel electrode and the transistor.

4. The electro-optical device according to claim 3,
wherein a predetermined constant potential is supplied to the first electrode via the capacitor line.

5. The electro-optical device according to claim 1,
wherein the first electrode is electrically connected to the pixel electrode and the transistor; and
the second electrode and the third electrode are electrically connected to the capacitor line.

6. The electro-optical device according to claim 5,
wherein a predetermined constant potential is supplied to the second electrode and the third electrode via the capacitor line.

7. An electronic apparatus comprising the electro-optical device according to claim 1.

\* \* \* \* \*